(12) United States Patent
Choi

(10) Patent No.: US 9,104,220 B2
(45) Date of Patent: Aug. 11, 2015

(54) REGULATOR AND VOLTAGE GENERATOR

(71) Applicant: SK hynix Inc., Icheon-si Gyeonggi-do (KR)

(72) Inventor: Won Beom Choi, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 211 days.

(21) Appl. No.: 13/846,827

(22) Filed: Mar. 18, 2013

(65) Prior Publication Data

US 2014/0167713 A1 Jun. 19, 2014

(30) Foreign Application Priority Data

Dec. 18, 2012 (KR) ........................ 10-2012-0148377

(51) Int. Cl.
*G11C 7/00* (2006.01)
*G05F 1/46* (2006.01)
(52) U.S. Cl.
CPC ..................................... *G05F 1/468* (2013.01)
(58) Field of Classification Search
CPC ........... H02M 3/07; H03M 1/765; G05F 1/10; G11C 5/145; G11C 16/30
USPC ................. 323/266–269, 271–275, 311–316; 365/189.09, 226; 327/534, 536, 540
See application file for complete search history.

(56) References Cited

U.S. PATENT DOCUMENTS

| 5,414,669 | A  | * | 5/1995  | Tedrow et al. | ................. | 365/226    |
|-----------|----|---|---------|---------------|------------------|------------|
| 5,946,258 | A  | * | 8/1999  | Evertt et al. | .................... | 365/226    |
| 6,297,624 | B1 | * | 10/2001 | Mitsui et al. | ................... | 323/316    |
| 6,448,750 | B1 | * | 9/2002  | Shor et al.   | ...................... | 323/282    |
| 6,518,830 | B2 | * | 2/2003  | Gariboldi et al. | .............. | 327/536    |
| 6,600,692 | B2 | * | 7/2003  | Tanzawa       | ........................ | 365/226    |
| 7,015,684 | B2 | * | 3/2006  | Chen          | ............................ | 323/316    |
| 7,049,880 | B2 | * | 5/2006  | Sivero et al. | ................... | 327/536    |
| 7,362,084 | B2 | * | 4/2008  | Tran et al.   | ...................... | 323/315    |
| 2009/0322297 | A1 | * | 12/2009 | Shiota       | ............................ | 323/282    |
| 2011/0069562 | A1 | * | 3/2011  | Conte et al.  | .............. | 365/189.09 |

FOREIGN PATENT DOCUMENTS

| KR | 10-0685644 B1 | 2/2007 |
|----|---------------|--------|
| KR | 1020100129575 A | 12/2010 |

* cited by examiner

*Primary Examiner* — Rajnikant Patel
(74) *Attorney, Agent, or Firm* — William Park & Associates Ltd.

(57) ABSTRACT

A regulator includes an input voltage adjusting unit configured to adjust a pumping voltage in response to a control signal varied depending on a target voltage and output the adjusted pumping voltage and a regulation unit configured to output the target voltage by regulating the adjusted pumping voltage. The regulator may reduce current consumption by adjusting the pumping voltage inputted according to the target voltage.

12 Claims, 5 Drawing Sheets

REGULATOR AND VOLTAGE GENERATOR

CROSS-REFERENCE TO RELATED APPLICATION

This application claims priority from Korean Patent Application No. 10-2012-0148377, filed on Dec. 18, 2012, the contents of which are incorporated herein by reference in its entirety.

BACKGROUND

1. Technical Field

Embodiments of the present invention generally relate to an electronic device, more particularly relate to a regulator and a voltage generator.

2. Related Art

A semiconductor memory is divided into a volatile memory device and a non-volatile memory device.

The volatile memory device means a memory device where stored data becomes lost if supplying of a power is stopped, and its writing velocity and reading velocity are rapid. The non-volatile memory device indicates a memory device where stored data remains though a power is not supplied, and its writing velocity and reading velocity are comparatively slow. Accordingly, the non-volatile memory device is used to store data needed to be maintained irrespective of supplying of the power. The non-volatile memory device includes a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. The flash memory device is divided into a NOR type memory device and a NAND type memory device.

A flash memory has an advantage of the RAM programmable and erasable data and an advantage of the ROM enabling to maintain stored data though supplying of the power is stopped. The flash memory has widely used as a storage medium of portable electronic device such as a digital camera, a personal digital assistant PDA and an MP3 player.

Current consumption of the semiconductor memory device increases due to various causes. The current consumption increases more because a voltage generator of the semiconductor memory device generates high voltage.

SUMMARY OF THE INVENTION

Embodiments of the present invention provides a regulator and a voltage generator for reducing current consumption.

A regulator according to an embodiment of the present invention includes an input voltage adjusting unit configured to adjust a pumping voltage in response to a control signal varied depending on a target voltage and output the adjusted pumping voltage; and a regulation unit configured to output the target voltage by regulating the adjusted pumping voltage.

The input voltage adjusting unit includes voltage down units for downing the pumping voltage, and the number of voltage down units activated in response to the control signal increases.

A voltage generator according to an embodiment of the present invention includes a pump configured to generate a pumping voltage by pumping an external voltage; and a regulator configured to output a target voltage by regulating the pumping voltage. The regulator includes an input voltage adjusting unit configured to adjust a pumping voltage in response to a control signal varied depending on a target voltage and output the adjusted pumping voltage; and a regulation unit configured to output the target voltage by regulating the adjusted pumping voltage.

A voltage generator according to other embodiments of the present invention includes a pump configured to generate a pumping voltage by pumping an external voltage; a pumping voltage controller configured to adjust the pumping voltage in response to a control signal varied depending on a target voltage and output the adjusted pumping voltage; and a regulation unit configured to output the target voltage by regulating the adjusted pumping voltage.

A regulator and a voltage generator of the present invention adjust the magnitude of a pumping voltage according to a target voltage, thereby reducing their current consumption.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
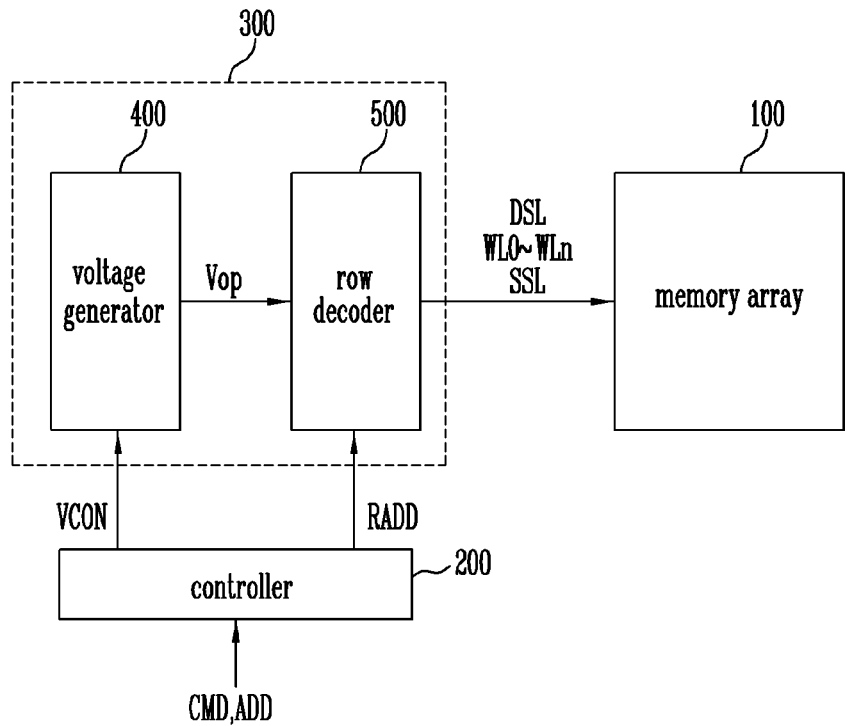
FIG. 1 is a view illustrating a semiconductor memory device according to an embodiment of the present invention.

FIG. 1 is a view illustrating a semiconductor memory device according to an embodiment of the present invention.

The semiconductor memory device of the present embodiments may include a memory array 100 having memory cells coupled to word lines, a voltage supplier 300 for supplying an operation voltage to the word lines and a controller 200 for controlling the voltage supplier 300.

The memory array 100 may include memory blocks. Each of the memory blocks may include strings coupled between bit lines and a common source line. That is, the strings are respectively coupled to the bit lines, and are coupled in common to a common source line. Respective strings may include a source select transistor, memory cells and a drain select transistor. A source of the source select transistor is coupled to the common source line, and a drain of the drain select transistor is coupled to the bit line. The memory cells are coupled in series between the select transistors. A gate of the source select transistor is coupled to a source select line, gates of the memory cells are respectively coupled to the word lines, and a gate of the drain select transistor is coupled to a drain select line.

The controller 200 outputs a voltage control signal VCON, for generating operation voltages needed for performing a program operation, a verify operation, a read operation or an erase operation, in response to a command signal CMD inputted from an external device through an input/output circuit. The controller 200 outputs a row address signal RADD in response to an address signal ADD inputted from the external device through the input/output circuit.

The voltage supplier 300 supplies operation voltages Vop, e.g. Verase (erase voltage), Vpgm (program voltage), Vread (read voltage), Vpass (pass voltage), Vvfy (verify voltage), Vdsl (drain select line voltage), Vssl (source select line voltage) and Vcsl (common source line voltage) needed for the program operation, the read operation and the erase operation of the memory cells to local lines of a selected memory block, in response to the voltage control signal VCON of the controller 200. The local lines includes a drain select line DSL, word lines WL0~WLn and a source select line SSL. The voltage supplier 300 may include a voltage generator 400 and a row decoder 500.

The voltage generator 400 outputs the operation voltages Vop needed for operation of the memory cells to global lines in response to the voltage control signal VCON of the controller 200.

The row decoder 500 couples the global lines to the local lines DSL, WL0~WLn and SSL in response to the row address signals RADD of the controller 200, to deliver the operation voltages outputted to the global lines from the voltage generator 400 to the local lines DSL, WL0~WLn and SSL of the selected memory block in the memory array 100.

Figure 2:
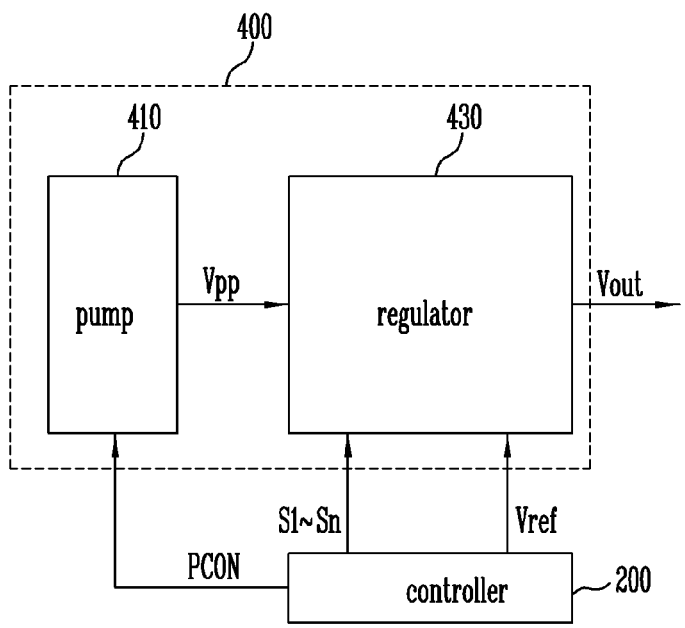
FIG. 2 is a block diagram illustrating the voltage generator in FIG. 1 according to an embodiment of the present invention.

FIG. 2 is a block diagram illustrating the voltage generator in FIG. 1 according to an embodiment of the present invention.

In FIG. 2, the voltage generator 400 of the present embodiments may include a pump 410 and a regulator 430.

The pump 410 generates a pumping voltage Vpp by pumping an external voltage.

The regulator 430 outputs a target voltage by regulating the pumping voltage Vpp.

The controller 200 outputs a control signal PCON for controlling the pump 410. The controller 200 outputs signals S1~Sn for controlling an input voltage of the regulator 430. The controller 200 outputs a reference voltage Vref to the regulator 430. The controller 200 may include a reference voltage generator (not shown). In an embodiment, the reference voltage generator may be located outside the controller 200, and the controller 200 may control the reference voltage generator to generate the reference voltage Vref.

In an embodiment, the voltage generator 400 may be included in an integrated circuit (not shown). The integrated circuit may include the controller 200, the voltage generator 400 and a peripheral circuit (not shown). The voltage generator 400 supplies an output voltage Vout to the peripheral circuit.

Figure 3:
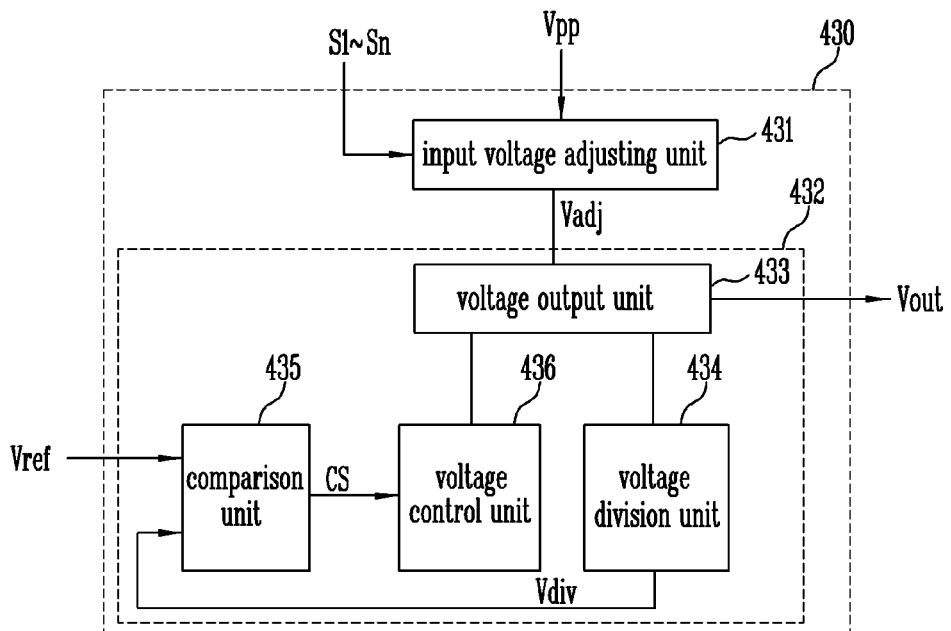
FIG. 3 is a block diagram illustrating the regulator in FIG. 2.

FIG. 3 is a block diagram illustrating the regulator in FIG. 2.

Figure 4:
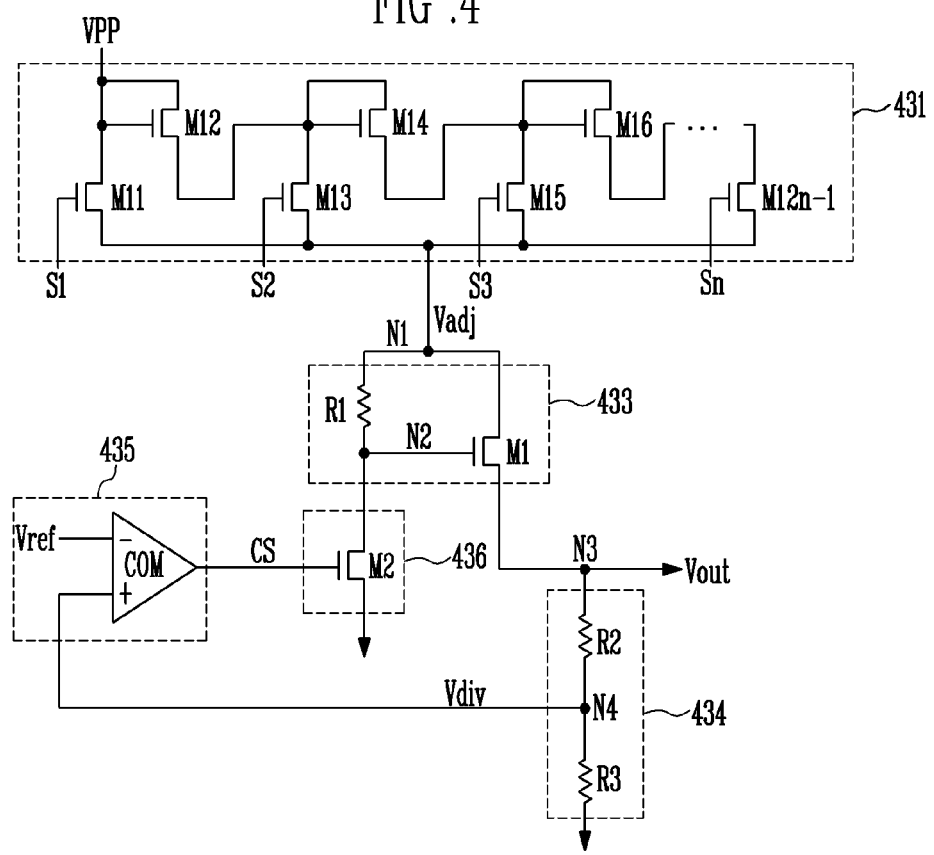
FIG. 4 is a view illustrating circuit of the regulator in FIG. 3 according to an embodiment of the present invention.

In FIG. 3 and FIG. 4, the regulator 430 may include an input voltage adjusting unit 431 and a regulation unit 432.

The input voltage adjusting unit 431 adjusts a pumping voltage Vpp in response to control signals S1~Sn varied depending on a preset target voltage, and outputs the adjusted pumping voltage Vadj.

The regulation unit 432 outputs a target voltage by regulating the adjusted pumping voltage Vadj.

The regulation unit 432 may include a voltage output unit 433, a voltage division unit 434, a comparison unit 435 and a voltage control unit 436.

The voltage output unit 433 outputs an output voltage Vout to an output node using the adjusted pumping voltage Vadj.

The voltage division unit 434 divides the output voltage Vout, and outputs a division voltage Vdiv in accordance with the dividing result.

The comparison unit 435 compares the reference voltage Vref with the division voltage Vdiv, and outputs a comparison signal CS in accordance with the comparing result.

The voltage control unit 436 controls voltage output of the voltage output unit 433 in response to the comparison signal CS.

FIG. 4 is a view illustrating a circuit of the regulator in FIG. 3 according to an embodiment of the present invention.

In FIG. 4, the input voltage adjusting unit 431 may include plural voltage down units M11~M12n-1 for downing the pumping voltage Vpp. Each of the voltage down units M11~M12n-1 may have substantially the same threshold voltage. In the event that a first voltage down unit M11 is turned on in response to a first control signal S1, a voltage (Vpp-Vth) downed from the pumping voltage Vpp by a threshold voltage Vth is outputted to a first node N1. A second voltage down unit M12 is always turned on due to its diode connection structure when a third voltage down unit M13 is turned on in response to a second control signal S2, and thus a voltage (Vpp-2Vth) downed from the pumping voltage Vpp by twice the threshold voltage Vth is outputted to the first node N1. The smaller the target voltage to be outputted from the regulator has magnitude, the more the control signal for turning on the number of the voltage down units is inputted to the input voltage adjusting unit 431.

The voltage output unit 433 may include a first resistor R1 and a first NMOS transistor M1. The first resistor R1 is coupled between the first node N1 and a second node N2. A drain of the first NMOS transistor M1 is coupled to the first node N1, a gate of the first NMOS transistor M1 is coupled to the second node N2, and a source of the first NMOS transistor M1 is coupled to a third node N3, i.e. the output node. The first NMOS transistor M1 delivers the adjusted pumping voltage Vadj to the output node N3 according to potential of the second node N2. The voltage output unit 433 outputs a voltage (Vadj-Vth) smaller by a threshold voltage Vth of the first NMOS transistor M1 than the adjusted pumping voltage Vadj to the output node N3, when the adjusted pumping voltage Vadj is inputted to the first node N1.

The voltage division unit 434 may include a second resistor R2 and a third resistor R3 coupled in series between the output node N3 and a ground terminal. The voltage of the output node N3 is divided by the second resistor R2 and the third resistor R3, and the voltage division unit 434 outputs the division voltage Vdiv according to the dividing result. The division voltage Vdiv is a voltage of a fourth node N4.

The comparison unit 435 includes a comparator COM. The reference voltage Vref is inputted to a negative (−) terminal of the comparator COM, and the division voltage Vdiv is inputted to a positive (+) terminal of the comparator COM. The comparator COM outputs the comparison signal CS having high level when the division voltage Vdiv is higher than the reference voltage Vref, and outputs the comparison signal CS having low level when the division voltage Vdiv is smaller than the reference voltage Vref.

The voltage control unit 436 may include a second NMOS transistor M2. The second NMOS transistor M2 couples the second node N2 to the ground terminal in response to the comparison signal CS. The second node N2 is discharged by the comparison signal CS having high level.

As described above, the regulator of the present embodiments inputs the control signal to the input voltage adjusting unit 431, so that the voltage outputted from the input voltage adjusting unit 431 reduces accordingly as the target voltage lowers. Since potential difference between the first node N1 and the second node N2 is reduced accordingly as the target voltage reduces, current flowing through the first resistor R1 reduces when the second NMOS transistor M2 is turned on. Accordingly, current consumption may be reduced. FIG. 4 also illustrates a third control signal S3 to nth control signal Sn (n being a positive integer).

Figure 5:
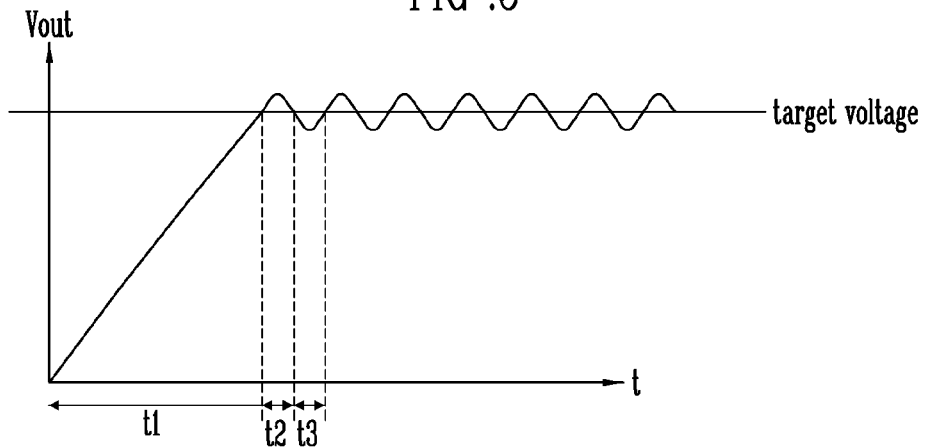
FIG. 5 is a view illustrating a process of outputting the target voltage by using the regulation unit in FIG. 4.

FIG. 5 is a view illustrating a process of outputting the target voltage by using the regulation unit 432 in FIG. 4 (see also FIG. 3). The x-axis displaying the an interval t (i.e., time).

In FIG. 4 and FIG. 5, the potential output voltage Vout of the output node N3 of the regulator 430 is smaller than the target voltage, in an interval of t1. In the event that the voltage output unit 433 outputs the voltage smaller by the threshold voltage Vth of the second NMOS transistor M2 than the adjusted pumping voltage Vadj, the potential output voltage Vout of the output node N3 increases. In the event that the division voltage Vdiv of the voltage division unit 434 is inputted to the comparison unit 435, the comparison unit 435 compares the reference voltage Vref with the division voltage Vdiv. Since the division voltage Vdiv is smaller than the reference voltage Vdiv, the comparison unit 435 outputs the comparison signal CS having a low level. As a result, the second NMOS transistor M2 in the voltage control unit 436 is not turned on. Since the second node N2 is not discharged, the adjusted pumping voltage Vadj is delivered to the output node N3.

In an interval of t2, the potential output voltage Vout of the output node N3 is higher than the target voltage. The comparison unit 435 outputs the comparison signal CS having high level when the division voltage Vdiv is higher than the reference voltage Vref. The second NMOS transistor M2 in the voltage control unit 436 is turned on. The second node N2 is discharged, and current path is formed. Since the first NMOS transistor M1 is not turned on, the adjusted pumping voltage Vadj is not delivered to the output node N3. Accordingly, the potential Vout of the output node N3 does not reduce.

In an interval of t3, the potential Vout of the output node N3 increases in substantially the same manner as the operation in the interval of t1. The above steps are iterated to output the target voltage.

Figure 6:
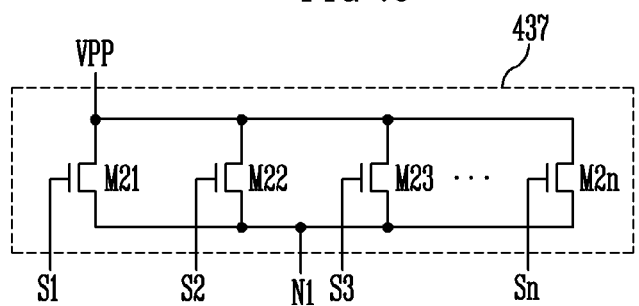
FIG. 6 is a view illustrating circuit of the input voltage adjusting unit in FIG. 3 according to other embodiments of the present invention.

FIG. 6 is a view illustrating a circuit of the input voltage adjusting unit 431 in FIG. 3 according to other embodiments of the present invention.

In FIG. 6, an input voltage adjusting unit 437 may include voltage down units M21~M2n of which voltage down levels differ. Threshold voltages of respective voltage down units M21~M2n may differ. The threshold voltage of a first voltage down unit M21 may have smallest level, and the threshold voltage of an nth voltage down unit M2n may have highest level.

A control signal is inputted to the input voltage adjusting unit 437, to turn on the voltage down unit having higher threshold voltage according as the target voltage to be outputted from the regulator lowers. FIG. 6 also illustrates first control signal S1 to the nth control signal Sn, first node N1, and pumping voltage VPP.

Figure 7:
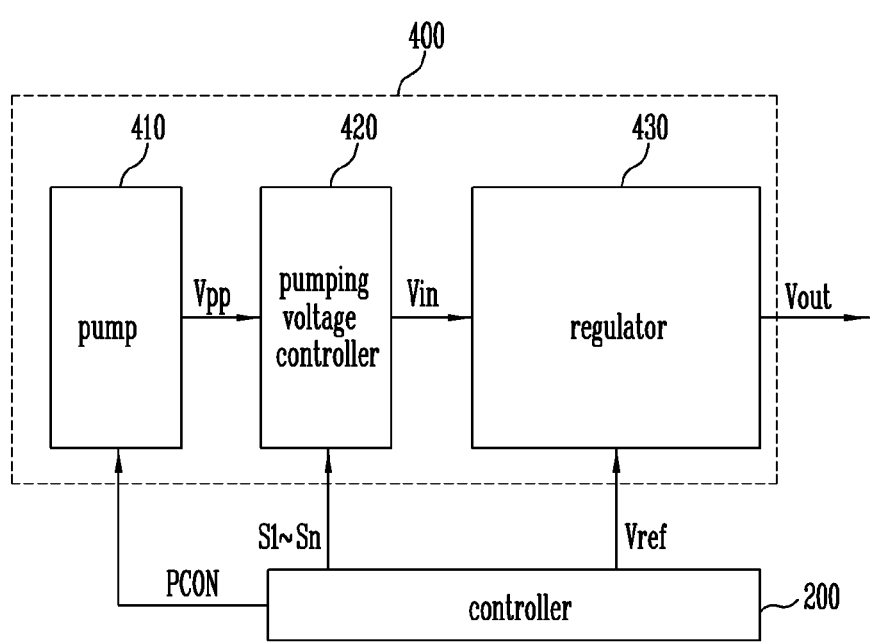
FIG. 7 is a block diagram illustrating the voltage generator in FIG. 1 according to other embodiments of the present invention.

FIG. 7 is a block diagram illustrating the voltage generator in FIG. 1 according to other embodiments of the present invention.

In FIG. 7, the voltage generator 400 of the present embodiments may include a pump 410, a pumping voltage controller 420 and a regulator 430.

The pump 410 generates a pumping voltage Vpp by pumping an external voltage.

The pumping voltage controller 420 adjusts the pumping voltage Vpp in response to control signals S1~Sn varied depending on preset target voltage to be outputted from the regulator 430 (i.e., output voltage Vout), and outputs the adjusted pumping voltage.

The regulator 430 regulates an input voltage Vin adjusted by the pumping voltage controller 420, to output the target voltage.

A controller 200 outputs a control signal PCON for controlling the pump 410. The controller 200 outputs the control signals S1~Sn for controlling the pumping voltage controller 420. The controller 200 outputs a reference voltage Vref to the regulator 430.

The pumping voltage controller 420 may be achieved with the input voltage adjusting unit 431 and 437 in FIG. 4 and FIG. 6.

Figure 8:
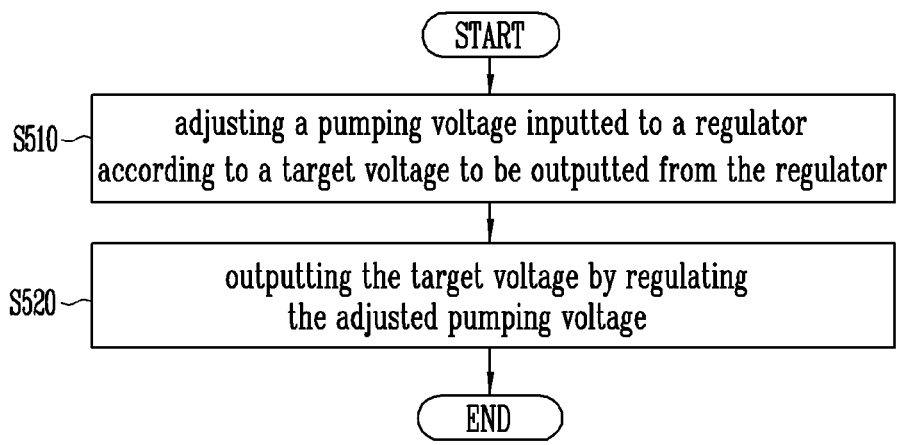
FIG. 8 is a flowchart illustrating a method of generating a voltage according to an embodiment of the present invention.

FIG. 8 is a flowchart illustrating a method of generating a voltage according to an embodiment of the present invention.

In FIG. 8, the method illustrated adjusts the pumping voltage inputted to the regulator according to the target voltage to be outputted from the regulator in step S510.

In step S520, the regulator outputs the target voltage by regulating the adjusted pumping voltage.

The pumping voltage is adjusted so that the pumping voltage inputted to the regulator lowers accordingly as the target voltage to be outputted from the regulator is small. Accordingly, current consumption may reduce while performing the regulation operation through the regulator.

Figure 9:
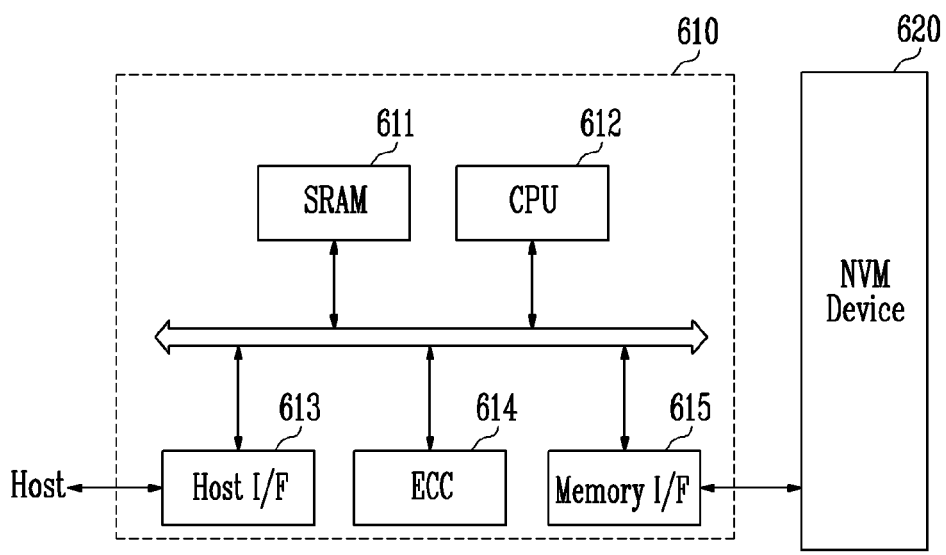
FIG. 9 is a block diagram illustrating schematically a memory system according to an embodiment of the present invention.

FIG. 9 is a block diagram illustrating schematically a memory system according to an embodiment of the present invention.

In FIG. 9, the memory system 600 of the present embodiment may include a non-volatile memory device 620 and a memory controller 610.

The non-volatile memory device 620 may use the semiconductor memory device described above for compatibility with the memory controller 610 and operate using the above method. The memory controller 610 controls the non-volatile memory device 620. The memory system 600 may be used as a memory card or a solid state disk SSD by combination of the non-volatile memory device 620 and the memory controller 610. An SRAM 611 is used as an operation memory of a processing unit 612. A host interface 613 has data exchange protocol of a host accessed to the memory system 600. An error correction block 614 detects and corrects error of data read from the non-volatile memory device 620. A memory interface 615 interfaces with the non-volatile memory device 620 of the present invention. The processing unit 612 performs control operation for data exchange of the memory controller 610.

The memory system 600 of the present invention may further include a ROM (not shown) for storing code data for interfacing with the host and so on. The non-volatile memory device 620 may be provided as multi-chip package including flash memory chips. The memory system 600 of the present invention may be provided as high-reliable storage medium having low error possibility. Specially, the flash memory device of the present invention may be included in the memory system 600 such as the SSD studied actively in recent. In this case, the memory controller 610 communicates with an external device, e.g. host through one of various interface protocols such as USB, MMC, PCI-E, SATA, PATA, SCSI, ESDI, IDE, etc.

Figure 10:
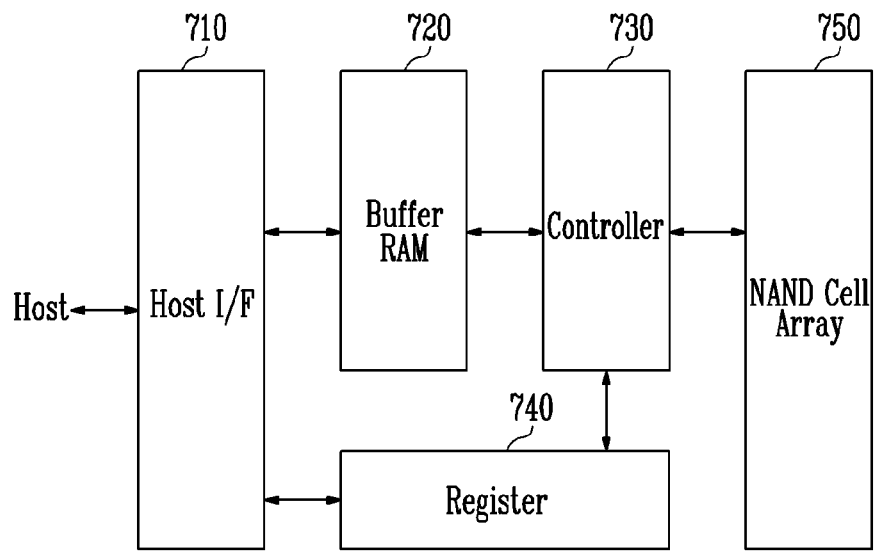
FIG. 10 is a block diagram illustrating schematically a fusion memory device or a fusion memory system for performing a program operation according to the embodiments described above.

FIG. 10 is a block diagram illustrating schematically a fusion memory device or a fusion memory system for performing a program operation according to the embodiments described above. For example, features of the present invention may be applied to an OneNAND flash memory device 700 as a fusion memory device.

The OneNAND flash memory device 700 includes a host interface 710 for exchanging information with a device using different protocol, a buffer RAM 720 for embedding code for driving the memory device or storing temporarily data, a controller 730 for controlling reading, programming and every state in response to a control signal and a command inputted from an external device, a register 740 for storing data such as configuration for defining a command, an address, system operation environment in the memory device, and a NAND flash cell array 750 having operation circuit including a non-volatile memory cell and a page buffer. The OneNAND flash memory device 700 programs data through the above method in response to write request from the host.

Figure 11:
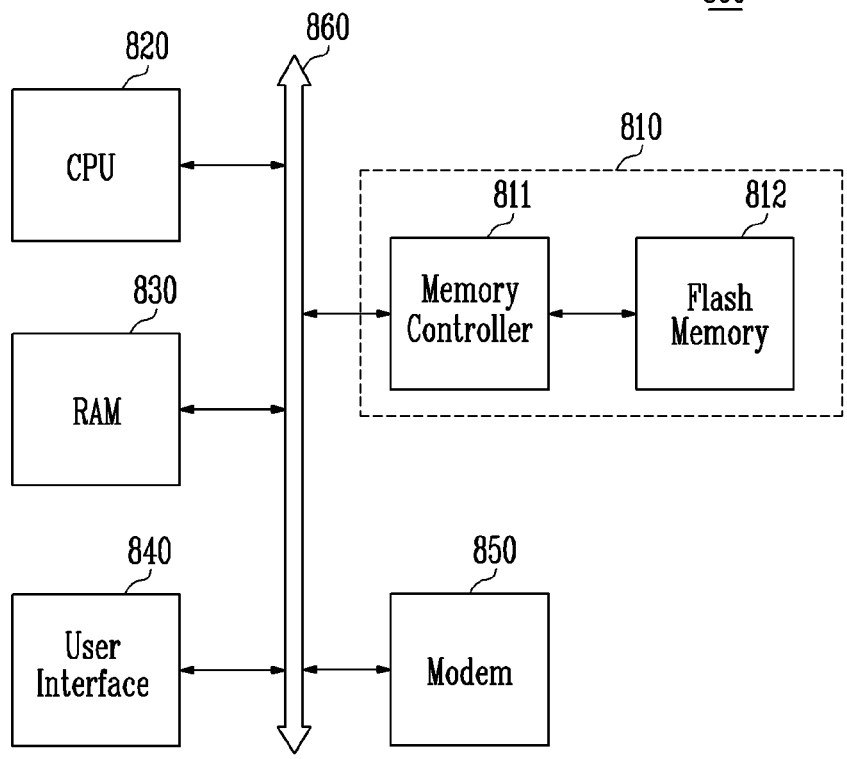
FIG. 11 is a view illustrating schematically a computing system including a flash memory device according to an embodiment of the present invention.

FIG. 11 is a view illustrating schematically a computing system including a flash memory device according to an embodiment of the present invention.

The computing system 800 of the present invention includes a microprocessor or central processing unit 820 connected electrically to a system bus 860, a RAM 830, a user interface 840, a modem 850 such as a baseband chipset and a memory system 810. In the event that the computing system 800 is a mobile device, a battery (not shown) for supplying an operation voltage to the computing system 800 may be further provided. The computing system 800 of the present invention may further include an application chipset, a camera image processor CIS, a mobile DRAM, etc., which are shown. The memory system 810 may include an SSD using for example a non-volatile memory for storing data. The memory system 810 may be applied to a fusion flash memory, e.g. OneNAND flash memory.

The embodiments of the present invention described above can be implemented in the form of program that may be performed using various computer means and can be recorded in a computer-readable medium. The implementation may be easily achieved by a person having ordinary skill in the art.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A regulator comprising:
   an input voltage adjusting unit configured to adjust a pumping voltage in response to a control signal varied depending on a predetermined target voltage and output the adjusted pumping voltage; and
   a regulation unit configured to output a target voltage by regulating the adjusted pumping voltage.

2. The regulator of claim 1, wherein the input voltage adjusting unit includes voltage down units for downing the pumping voltage, and the number of voltage down units activated increases in response to an increase in control signals.

3. The regulator of claim 1, wherein the input voltage adjusting unit includes voltage down units of which voltage down levels differ, and a voltage down unit having a high voltage down level is activated in response to the control signal.

4. The regulator of claim 1, wherein the regulation unit includes:
   a voltage output unit configured to output an output voltage using the adjusted pumping voltage;
   a voltage division unit configured to output a division voltage by dividing the output voltage;
   a comparison unit configured to compare a reference voltage with the division voltage, and output a comparison signal according to the comparing result; and
   a voltage control unit configured to control voltage output of the voltage output unit in response to the comparison signal.

5. A voltage generator comprising:
   a pump configured to generate a pumping voltage by pumping an external voltage; and
   a regulator configured to output a target voltage by regulating the pumping voltage,
   wherein the regulator includes:
   an input voltage adjusting unit configured to adjust a pumping voltage in response to a control signal varied depending on a predetermined target voltage and output the adjusted pumping voltage; and
   a regulation unit configured to output the target voltage by regulating the adjusted pumping voltage.

6. The voltage generator of claim 5, wherein the input voltage adjusting unit includes voltage down units for downing the pumping voltage, and the number of voltage down units activated increases in response to an increase in control signals.

7. The voltage generator of claim 5, wherein the input voltage adjusting unit includes voltage down units of which voltage down levels differ, and a voltage down unit having a high voltage down level is activated in response to the control signal.

8. The voltage generator of claim 5, wherein the regulation unit includes:
   a voltage output unit configured to output an output voltage using the adjusted pumping voltage;
   a voltage division unit configured to output a division voltage by dividing the output voltage;
   a comparison unit configured to compare a reference voltage with the division voltage, and output a comparison signal according to the comparing result; and
   a voltage control unit configured to control voltage output of the voltage output unit in response to the comparison signal.

9. A voltage generator comprising:
   a pump configured to generate a pumping voltage by pumping an external voltage;
   a pumping voltage controller configured to adjust the pumping voltage in response to a control signal varied depending on a predetermined target voltage and output the adjusted pumping voltage; and a regulation unit configured to output a target voltage by regulating the adjusted pumping voltage.

10. The voltage generator of claim 9, wherein the pumping voltage controller includes voltage down units for downing the pumping voltage, and the number of voltage down units activated increases in response to an increase in control signals.

11. The voltage generator of claim 9, wherein the pumping voltage controller includes voltage down units of which voltage down levels differ, and a voltage down unit having a high voltage down level is activated in response to the control signal.

12. The voltage generator of claim 9, wherein the regulation unit includes:
   a voltage output unit configured to output an output voltage using the adjusted pumping voltage;
   a voltage division unit configured to output a division voltage by dividing the output voltage;
   a comparison unit configured to compare a reference voltage with the division voltage, and output a comparison signal according to the comparing result; and
   a voltage control unit configured to control voltage output of the voltage output unit in response to the comparison signal.

* * * * *